(12) United States Patent
Heo et al.

(10) Patent No.: US 8,525,275 B2
(45) Date of Patent: Sep. 3, 2013

(54) METHODS OF FORMING NON-VOLATILE MEMORY DEVICES (75) Inventors: Jin-Hwa Heo, Suwon-si (KR); Chul-Sung Kim, Seongnam-si (KR); Bon-Young Koo, Suwon-si (KR); Ki-Hyun Hwang, Seongnam-si (KR); Chang-Hyun Lee, Suwon-si (KR)

(73) Assignee: Samsung Electronics Co., Ltd. (KR)

( * ) Notice: Subject to any disclaimer, the term of this patent is extended or adjusted under 35 U.S.C. 154(b) by 2 days.

(21) Appl. No.: 12/916,718

(22) Filed: Nov. 1, 2010

(65) Prior Publication Data

US 2011/0045647 A1    Feb. 24, 2011

Related U.S. Application Data (62) Division of application No. 11/950,143, filed on Dec. 4, 2007, now abandoned.

(30) Foreign Application Priority Data

Jul. 16, 2007 (KR) .................. 10-2007-0071237

(51) Int. Cl.
*H01L 21/336* (2006.01)

(52) U.S. Cl.
USPC ........... 257/411; 257/288; 257/314; 257/368; 257/410; 257/E21.423; 438/584; 438/585; 438/591; 438/761; 438/762

(58) Field of Classification Search
USPC ......................................... 438/775
See application file for complete search history.

(56) References Cited

U.S. PATENT DOCUMENTS

| | | |
|---|---|---|
| 5,270,298 A | 12/1993 | Ramesh |
| 5,424,567 A | 6/1995 | Chen |
| 5,583,067 A | 12/1996 | Sanchez |
| 5,768,192 A | 6/1998 | Eitan |
| 5,923,056 A | 7/1999 | Lee et al. |
| 6,141,256 A | 10/2000 | Forbes |
| 6,163,049 A | 12/2000 | Bui |
| 6,225,646 B1 | 5/2001 | Gardner et al. |
| 6,236,076 B1 | 5/2001 | Arita et al. |
| 6,294,436 B1 | 9/2001 | Park et al. |
| 6,297,517 B1 | 10/2001 | Matsumoto et al. |
| 6,307,775 B1 | 10/2001 | Forbes et al. |
| 6,417,537 B1 | 7/2002 | Yang et al. |
| 6,458,677 B1 | 10/2002 | Hopper et al. |
| 6,465,828 B2 | 10/2002 | Agarwal |
| 6,489,649 B2 | 12/2002 | Kobayashi et al. |
| 6,512,274 B1 | 1/2003 | King et al. |

(Continued)

FOREIGN PATENT DOCUMENTS

| | | |
|---|---|---|
| JP | 63-141 A | 1/1988 |
| JP | 8-17945 A | 1/1996 |

(Continued)

*Primary Examiner* — Cheung Lee
*Assistant Examiner* — William Harriston
(74) *Attorney, Agent, or Firm* — Myers Bigel Sibley & Sajovec, P.A.

(57) ABSTRACT

A non-volatile memory device includes a dielectric layer between a charge storage layer and a substrate. Free bonds of the dielectric layer can be reduced to reduce/prevent charges from leaking through the free bonds and/or from being trapped by the free bonds. As a result, data retention properties and/or durability of a non-volatile memory device may be enhanced.

3 Claims, 5 Drawing Sheets (56) References Cited

U.S. PATENT DOCUMENTS

| | | |
|---|---|---|
| 6,614,069 B2 | 9/2003 | Rösner et al. |
| 6,627,494 B2 | 9/2003 | Joo et al. |
| 6,730,960 B2 | 5/2004 | Forbes |
| 6,768,165 B1 | 7/2004 | Eitan |
| 6,791,883 B2 | 9/2004 | Swift et al. |
| 6,803,272 B1 | 10/2004 | Halliyal et al. |
| 6,844,604 B2 | 1/2005 | Lee et al. |
| 6,858,899 B2 | 2/2005 | Mahajani et al. |
| 6,885,058 B2 | 4/2005 | Wils et al. |
| 6,906,366 B2 | 6/2005 | Hsu et al. |
| 6,924,186 B2 | 8/2005 | Sandhu et al. |
| 6,949,788 B2 | 9/2005 | Fujiwara et al. |
| 6,958,511 B1 * | 10/2005 | Halliyal et al. ............... 257/314 |
| 6,963,103 B2 | 11/2005 | Forbes |
| 7,087,954 B2 | 8/2006 | Forbes |
| 7,109,548 B2 | 9/2006 | Forbes et al. |
| 7,116,577 B2 | 10/2006 | Eitan |
| 7,419,918 B2 | 9/2008 | Kim et al. |
| 2002/0182893 A1 * | 12/2002 | Ballantine et al. ............ 438/795 |
| 2003/0155605 A1 | 8/2003 | Jong et al. |
| 2004/0021170 A1 | 2/2004 | Caywood |
| 2005/0023603 A1 | 2/2005 | Eldridge et al. |
| 2005/0189600 A1 | 9/2005 | Ohuchi et al. |
| 2005/0247970 A1 | 11/2005 | Jeon et al. |
| 2005/0266637 A1 * | 12/2005 | Wang ........................... 438/257 |
| 2006/0105553 A1 * | 5/2006 | Wellhausen ................. 438/526 |
| 2006/0228841 A1 | 10/2006 | Kim et al. |
| 2006/0228899 A1 * | 10/2006 | Nansei et al. ................. 438/769 |
| 2006/0270157 A1 | 11/2006 | Joo |
| 2006/0273411 A1 * | 12/2006 | Triyoso et al. ................ 257/410 |
| 2007/0018231 A1 * | 1/2007 | Mitani et al. .................. 257/315 |
| 2007/0145454 A1 * | 6/2007 | Bhattacharyya .............. 257/311 |
| 2007/0167030 A1 * | 7/2007 | Jee et al. ........................ 438/769 |
| 2008/0001237 A1 * | 1/2008 | Chang et al. .................. 257/411 |
| 2008/0079061 A1 * | 4/2008 | Ding et al. .................... 257/324 |
| 2008/0079111 A1 * | 4/2008 | Clark ............................ 257/506 |
| 2010/0171169 A1 | 7/2010 | Mitani et al. |

FOREIGN PATENT DOCUMENTS

| | | |
|---|---|---|
| JP | 11-8325 A | 1/1999 |
| JP | 2001-77319 A | 3/2001 |
| JP | 2002-203917 A | 7/2002 |
| JP | 2003-332467 A | 11/2003 |
| JP | 2006-229195 A | 8/2006 |
| JP | 2006-339624 A | 12/2006 |
| KR | 2001-0066386 A | 7/2001 |
| KR | 2003-0057851 A | 7/2003 |
| KR | 10-2004-0054146 A | 6/2004 |
| KR | 10-2004-0108309 A | 12/2004 |
| KR | 10-2005-0102864 A | 10/2005 |
| KR | 10-0644397 | 11/2006 |
| KR | 10-2006-0124001 A | 12/2006 |
| KR | 10-2007-0013223 | 1/2007 |
| WO | WO 00/75997 A1 | 12/2000 |

* cited by examiner

METHODS OF FORMING NON-VOLATILE MEMORY DEVICES

RELATED APPLICATIONS

This U.S. non-provisional patent application is a divisional of U.S. patent application Ser. No. 11/950,143, filed Dec. 4, 2007, which itself claims priority under 35 U.S.C. §119 of Korean Patent Application 2007-0071237 filed on Jul. 16, 2007, the entirety of both of which are hereby incorporated by reference.

FIELD OF THE INVENTION

The present invention relates to semiconductor devices and methods of forming the same. More specifically, the present invention is directed to non-volatile memory devices and methods of forming the same.

BACKGROUND OF THE INVENTION

Non-volatile memory devices retain their stored data even when their power supplies are interrupted. Flash memory devices are well known as representative non-volatile memory devices. A flash memory device includes a unit cell with an electrically isolated charge storing element. A threshold voltage of a flash memory cell can be regulated by storing charges in the charge storing element or ejecting charges from the charge storing element, so as to store predetermined logical data in the flash memory cell and allow the stored logical data to be read therefrom. A flash memory device can write and/or erase data electrically.

Conventionally, a flash memory device requires low operation voltages (e.g. a program voltage, an erase voltage and/or a verify voltage, etc.). With the rise of operation voltages such as a program voltage and/or an erase voltage, characteristics of an oxide layer that is formed to surround a charge storing element may become degraded and result in erroneous operation, such as loss of the data stored in the charge storing element.

In addition, flash memory devices are required to have long-term data retention characteristics. However, charges stored in the charge storing element may leak through an oxide layer (e.g., an oxide layer interposed between the charge storing element and a semiconductor substrate). Thus, stored data may be lost over time and thereby cause malfunction of the flash memory device.

SUMMARY OF THE INVENTION

Exemplary embodiments of the present invention are directed to non-volatile memory devices and methods of forming the same. In an embodiment thereof, the non-volatile memory device may include: a dielectric layer including an oxide layer on a substrate, the dielectric layer including at least two regions therein that each extend across at least a major extent of the dielectric layer and have significantly higher nitrogen concentration relative to other regions of the dielectric layer; a charge storage layer on the dielectric layer; a blocking insulating layer on the charge storage layer; and a gate electrode on the blocking insulating layer.

In another embodiment, the method may include: forming a dielectric layer including a nitride layer on a substrate; transforming at least a portion of the nitride layer extending across at least a major lateral extent of the dielectric layer to include added oxygen; forming a charge storage layer on the dielectric layer; forming a blocking insulating layer on the charge storage layer; and forming a gate electrode on the blocking insulating layer.

In yet another embodiment, the method may include: forming a dielectric layer on a substrate; reacting at least a major portion of free bonds remaining in the dielectric layer with each other; forming a charge storage layer on the dielectric layer; forming a blocking insulating layer on the charge storage layer; and forming a gate electrode on the blocking insulating layer.

In still another embodiment, the method may include: forming an oxide layer on a substrate; forming a nitride layer on the oxide layer; oxidizing at least a portion of the nitride layer; forming a charge storage layer on the oxidized nitride layer; forming a blocking insulating layer on the charge storage layer; and forming a gate electrode on the blocking insulating layer.

DETAILED DESCRIPTION OF THE INVENTION

Embodiments of the present invention now will be described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like numbers refer to like elements throughout.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present invention. As used herein, the term "and/or" includes any and all combinations of one or more of the associated listed items.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" "comprising," "includes" and/or "including" when used herein, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms used herein should be interpreted as having a meaning that is consistent with their meaning in the context of this specification and the relevant art and will not be interpreted in an idealized or overly formal sense unless expressly so defined herein.

It will be understood that when an element such as a film, region or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, film or region to another element, film or region as illustrated in the figures. It will be understood that these terms are intended to encompass different orientations of the device in addition to the orientation depicted in the figures.

Embodiments of the invention are described herein with reference to cross-section illustrations that are schematic illustrations of idealized embodiments (and intermediate structures) of the invention. The thickness of films and regions in the drawings may be exaggerated for clarity. Additionally, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a discrete change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the invention.

Figure 6:
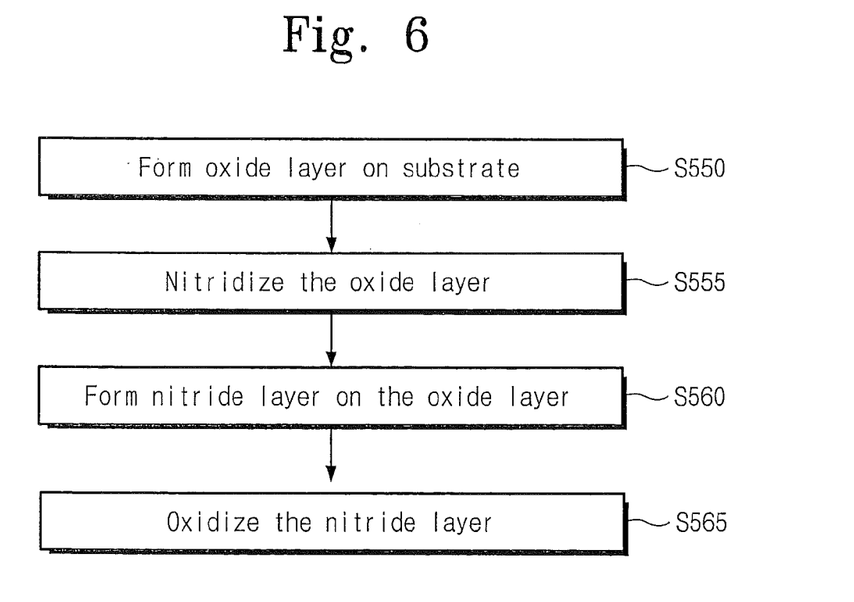
FIG. 6 is a flowchart illustrating methods of forming a dielectric layer in a non-volatile memory device according to some embodiments of the present invention.
Figure 7:
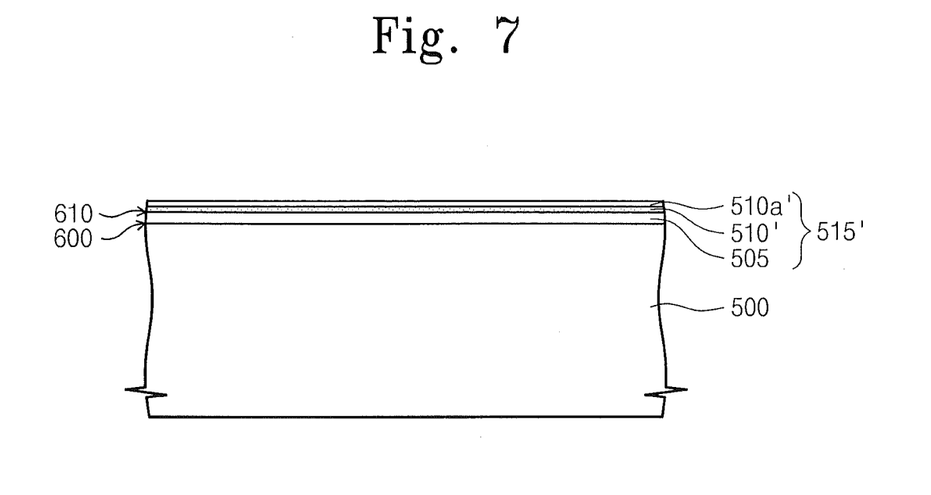
FIG. 7 is a cross-sectional view illustrating other methods of forming a non-volatile memory device according to some embodiments of the present invention.

FIGS. 1 through 5 are cross-sectional views illustrating methods of forming a non-volatile memory device according to some embodiments of the present invention. FIG. 6 is a flowchart illustrating methods of forming a dielectric layer in a non-volatile memory device according to some embodiments of the present invention, and FIG. 7 is a cross-sectional view illustrating other methods of forming a non-volatile memory device according to some embodiment of the present invention.

Figure 1:
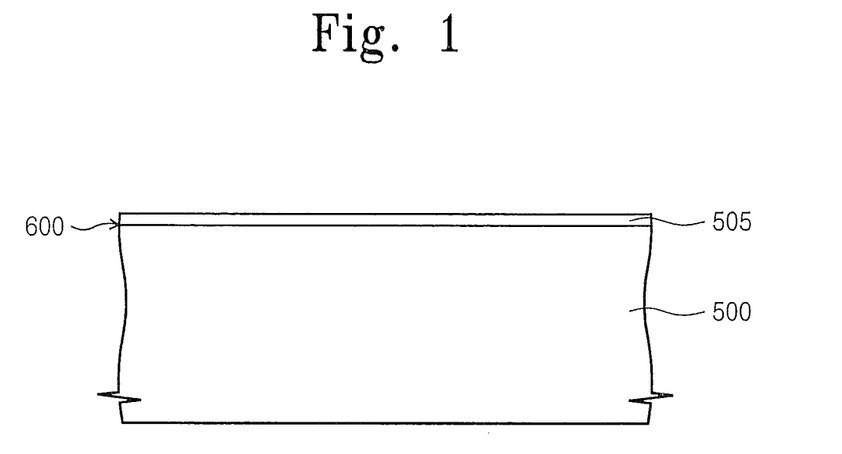
FIGS. 1 through 5 are cross-sectional views illustrating methods of forming a non-volatile memory device according to some embodiments of the present invention.
Figure 2:
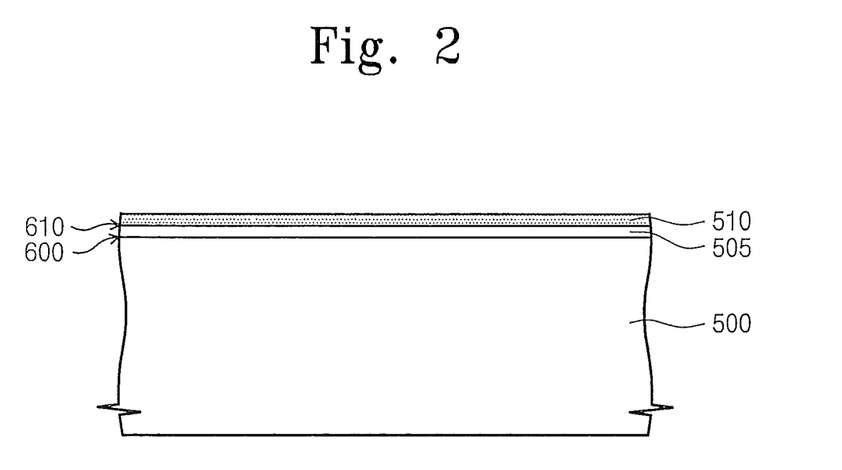
Figure 3:
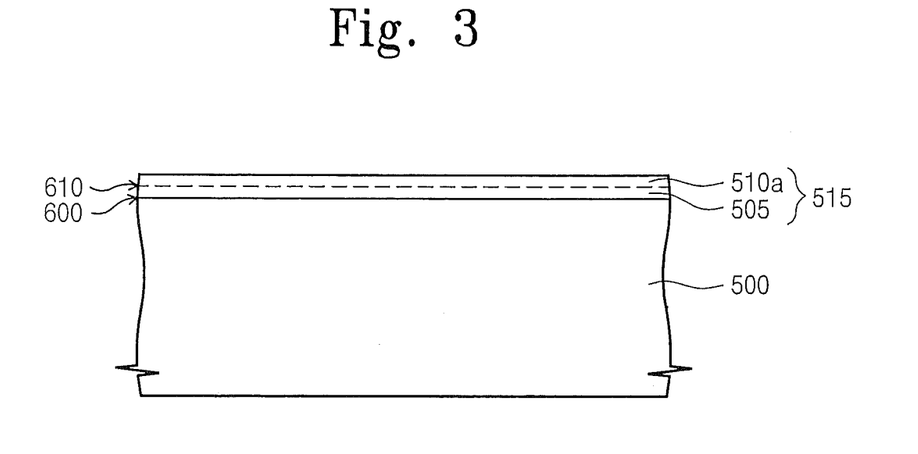

Referring to FIGS. 1 through 6, some methods of forming a non-volatile memory device include forming a dielectric layer (515 of FIG. 3) on a semiconductor substrate 500, which will be described below in detail with reference to the flowchart of FIG. 6 and the cross-sectional views of FIGS. 1 through 3.

An oxide layer 505 is formed on the substrate 500 (S550). The oxide layer 505 may be formed as thermal oxide by a thermal oxidation process carried out on the substrate 500. Alternatively, the oxide layer 505 may be formed by depositing oxide, such as by a chemical vapor deposition (CVD), on the substrate 500. A device isolation layer (not shown) may be formed in the substrate 500 to define an active region (not shown). The active region may be defined in a portion of the substrate 500 that is surrounded by the device isolation layer. The oxide layer 505 may be restrictively formed on a defined portion of a top surface of the active region, or it may be formed on the entire surface of the substrate 500. The oxide layer 505 may be formed before or after the formation of the device isolation layer.

After the oxide layer 505 is formed (S550), it may be subjected to a nitridation treatment (S555) in which nitrogen atoms are introduced into the oxide layer 505. The introduced nitrogen atoms may accumulate at a first interface region 600 between the oxide layer 505 and the substrate 500, and result in a significant nitrogen concentration (e.g., substantially more nitrogen concentration) at the first interface region 600 relative to other areas thereof. The first interface region 600 having the significant nitrogen concentration is hereinafter referred to as a first nitrogen accumulation region. The first nitrogen accumulation region may have a nitrogen concentration in a range of, for example, 1 to 20 percent per volume. However, the nitrogen concentration of the first nitrogen accumulation region is not limited to any particular range.

Free bonds (e.g., free dangling bonds) may be created at the first interface region 600 by the different materials of the oxide layer 505 and the substrate 500 contacting each other. The term free bonds is used herein to refer to an unsaturated bonding state, and may be created when atoms in the first interface region 600 are not bonded completely to one another. The free bonds of the first boundary region 600 can be significantly reduced by the nitridation treatment (S555) introducing nitrogen atoms into the oxide layer 505. In particular, the nitrogen atoms of the first nitrogen accumulation region, formed by the nitridation treatment, can bond to at least some of the free bonds of the first interface region 600, and thereby eliminate those free bonds.

A relatively small amount of bulk free bonds may exist in the oxide layer 505, and can bond to the nitrogen atoms that are introduced by the nitridation treatment (S555). Thus, bulk free bonds in the oxide layer 505 may also be reduced by than the nitridation treatment (S555).

The nitridation treatment may be performed at least in part by a thermal nitridation process, a plasma nitridation process, and/or a radical nitridation process. The radical nitridation process is a nitridation process that uses a process gas with a sufficiently excited radical state. The plasma nitridation process and/or the radical nitridation process may use heat energy auxiliary. The process gas of the nitridation treatment may include at least one selected from the group consisting of nitrogen ($N_2$) gas, nitrogen oxide (NO) gas, dinitrogen oxide ($N_2O$) gas, and ammonia ($NH_3$) gas.

Referring to FIGS. 2 and 6, a nitride layer 510 is formed on the oxide layer 505 (S560). The nitride layer 510 may be formed with, for example, silicon nitride. The nitride layer 510 may be formed by chemical vapor deposition (CVD). The nitride layer 510 may include free bonds, which may be created when atoms of the nitride layer 510 are not completely bonded to other atoms. The nitride layer 510 can be formed directly on the oxide layer 505, which may result in the formation of a second interface region 610 between the nitride layer 510 and the oxide layer 505.

Referring to FIGS. 3 and 6, an oxidation process is performed to oxidize the nitride layer 510 (S565). The oxidized nitride layer 510a and the oxide layer 505 can form a dielectric layer 515. During an erase operation and/or a program operation of a non-volatile memory device including the exemplary structure, charges can tunnel through the dielectric layer 515.

The oxidation process (S565) transforms at least a portion of the nitride layer 510 extending across at least a major lateral extent of the dielectric layer to contain added oxygen. The oxygen added to the nitride layer 510 by the oxidation process (S565) can reduce free bonds in the oxidized nitride layer 510a. In particular, the oxidation process (S565) reacts at least some of the free bonds in the nitride layer 510 with each other and, thereby, reduces the free bonds in the oxidized nitride layer 510a. Oxygen atoms supplied by the oxidation process (S565) can replace some nitrogen atoms and the nitride layer 510. In the course of the substitution, at least some of the free bonds in the nitride layer 510 may react with each other and, thereby, be eliminated. As a result, the amount of free bonds in the oxidized nitride layer 510a can be substantially reduced relative to the amount of free bonds in the nitride layer 510.

At least a portion of the oxidized nitride layer 510 may be formed from oxide. As previously explained, oxygen atoms can replace some nitrogen atoms of the nitride layer 510, and thereby form at least a portion of the oxidized nitride layer 510a from oxide. Following the oxidation process (S565), the nitrogen atoms replaced by the oxygen atoms may primarily accumulate in a defined region of the dielectric layer 515. Alternatively, the replaced nitrogen atoms may be released from the dielectric layer 515 by being converted to gaseous form. The gaseous nitrogen atoms can be exhausted from a process chamber in which the oxidation process is performed.

As illustrated in FIG. 3, the nitride layer 510 may be fully oxidized by the oxidation process, such as by oxidizing the entire nitride layer 510 through the oxidation process. Thus, a substantial portion or all of the oxidized nitride layer 510a may be formed of oxide, and a substantial portion or all of the dielectric layer 515 may be formed of oxide. At this point, a part of the nitrogen atoms replaced by the oxygen atoms may accumulate in a predetermined region of the dielectric layer 515 to form a region having a significant nitrogen concentration in the dielectric layer 515 relative to other areas thereof. The region of the dielectric layer 515 having a significant nitrogen concentration is hereinafter referred to as a second nitrogen accumulation region. The second nitrogen accumulation region may be formed along the second interface region 610. The second nitrogen accumulation region may have a nitrogen concentration in a range of, for example, 1 to 15 percent per volume. However, the nitrogen concentration of the second nitrogen accumulation region is not limited to any particular range.

A relatively small amount of bulk free bonds may also exist in the oxidized nitride layer 510a. At least some of the bulk free bonds in the oxidized nitride layer 510a may bond to the substituted nitrogen atoms, which may substantially reduce or eliminate the presence of bulk free bonds in the oxidized nitride layer 510a.

As illustrated in FIG. 7, the nitride layer 510 may be partially oxidized, such as along an upper portion thereof, by the oxidation process. Accordingly, a dielectric layer 515' can be formed that includes an oxide layer 505, a residual nitride layer 510', and an oxidized nitride layer 510a, which are stacked in the listed order. Free bonds can be significantly reduced in the oxidized portion of the nitride layer 510.

For the convenience of description, a process of fully oxidizing the nitride layer 510 is hereinafter referred to as a full oxidation process and a process of partially oxidizing the nitride layer 510 is hereinafter referred to as a partial oxidation process.

Returning to FIG. 6, some methods of forming a dielectric layer according to embodiments of the present invention may include repeatedly performing the steps S560 and S565 at least two times. The repetitively performed oxidation step S565 may each be the full oxidation process or the partial oxidation process, or, alternatively, some of the repetitively performed oxidation steps S565 may be the full oxidation process and some others may be the partial oxidation process.

As described above, in the case where the nitride layer 510 is fully oxidized, the dielectric layer 515 includes at least the first and second nitrogen accumulation regions. When the steps S560 and S565 are repeatedly performed at least two times and at least one of the repeatedly performed steps S565 is the full oxidation process, the dielectric layer can include at least three regions each having a substantially high nitrogen concentration. The dielectric layer 515 may have a sufficient thickness, such as greater than 25 angstroms, to inhibit/prevent direct tunneling of charges therethrough during operation of the non-volatile memory device formed therewith.

The oxidation process can be carried out using a process gas containing oxygen. For example, the oxidation process may use a process gas containing at least one selected from the group consisting of oxygen ($O_2$) gas, ozone ($O_3$) gas, and vapor ($H_2O$). The oxidation process may be carried out as a dry oxidation process, a wet oxidation process, a radical oxidation process, a plasma oxidation process, and/or an oxidation process using hydrogen chloride.

Returning to FIG. 4, a charge storage layer 520 is formed on the dielectric layer 515. A blocking insulating layer 525 is formed on the charge storage layer 520. A gate conductive layer 530 is formed on the blocking insulating layer 525. The dielectric layer 515 can be replaced with a dielectric layer 515' shown in FIG. 7. Furthermore, the dielectric layer 515 can be replaced with any one or more of the dielectric layers described herein.

Figure 4:
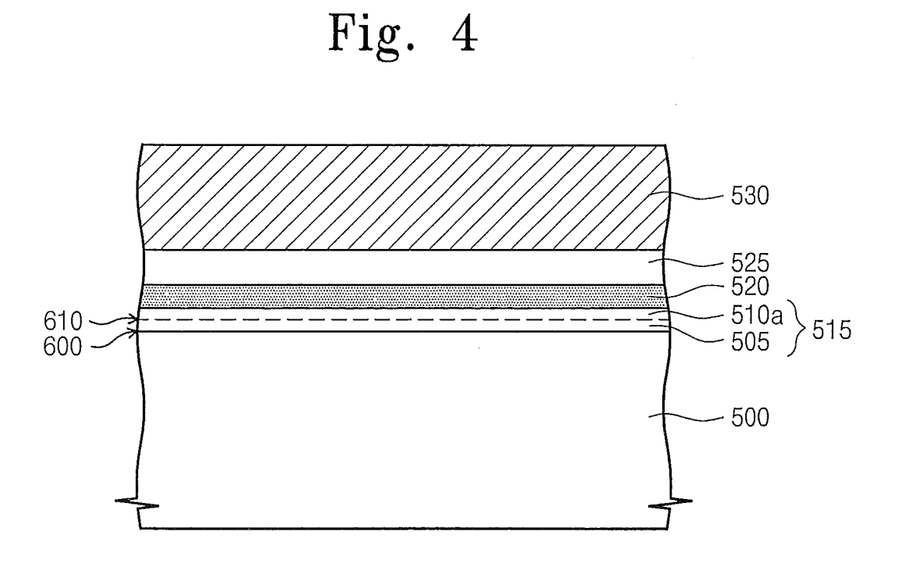

The charge storage layer 520 can be formed from a material that is configured to store charges. Further, the charge storage layer 520 may include trap sites to store charges. The charge storage layer 520 may include a single layer or multiple layers. For example, the charge storage layer 520 may include at least one material selected from the group consisting of silicon nitride, silicon oxynitride, a high-k dielectric (e.g., hafnium aluminate, hafnium silicate, etc.) having a higher dielectric constant than silicon oxide, and an insulating material where dots (described below) can be uniformly distributed in the insulating material. The hafnium aluminate may be HfSiO or HfSiON. The dots may be formed from silicon, silicon germanium, and/or metal, and can be defined in relatively small spaced apart regions in the insulating material. The charge storage layer 520 may include at least one insulating layer having the same as or higher dielectric constant than the blocking insulating layer 525.

Alternatively, the charge storage layer 520 may be formed of doped silicon or undoped silicon. In this case, the dielectric layer 515 and the charge storage layer 520 may be formed on the active region (not shown) to be self-aligned to the active region. The blocking insulating layer 525 may be formed after the formation of the device isolation layer (not shown).

The blocking insulating layer 525 may be a single layer or multiple layers. The blocking insulating layer 525 includes at least one insulating layer having a higher dielectric constant than the dielectric layer 515. In particular, the blocking insulating layer 525 may include at least one insulating layer having a higher dielectric constant than a highest dielectric constant portion (e.g., a highest dielectric constant of a major portion) of the dielectric layer 515. The first and second nitrogen accumulation regions may have a higher dielectric constant than a substantially low nitrogen concentration portion of the dielectric layer 515. In this case, the blocking insulating layer 525 may include at least one insulating layer having a higher dielectric constant than the first and second nitrogen accumulation regions.

Referring to FIG. 7, when the dielectric layer 515' includes a residual insulating layer 510', the blocking insulating layer 525 may include at least one insulating layer having a higher dielectric constant than the residual nitride layer 510'. For example, the blocking insulating layer 525 may include an insulative metal oxide (e.g., hafnium oxide, aluminum oxide, etc.) having a high-k dielectric constant, hafnium aluminate (e.g., HfAlO or HfAlON), and/or hafnium silicate (e.g., HfSiO or HfSiON).

When both the charge storage layer 520 and the blocking insulating layer 525 include hafnium aluminate or hafnium silicate, a hafnium ratio of the charge storage layer 520 (e.g., concentration of hafnium relative to other material(s) in the charge storage layer 520) may be higher than that of the blocking insulating layer 525. Consequently, a trap density of the charge storage layer 520 may be increased and the insulating characteristics of the blocking insulating layer 525 may be enhanced.

The gate conductive layer 530 may be a single layer or multiple layers. The gate conductive layer 530 may include doped silicon, metal, conductive metal nitride, a metal containing material, and/or metal silicide. At least a portion of the gate conductive layer 530 contacting the blocking insulating layer 525 can be formed from a conductive material having a high work function to decrease/prevent charge tunneling through the blocking insulating layer 525. In particular, at least a portion of the gate conductive layer 530 contacting the blocking insulating layer 525 may be formed from a conductive material having a work function that is equal to or higher than 4.0 eV. For example, at least a portion of the gate conductive layer 530 contacting the blocking insulating layer 525 may include P-type silicon, Ti, TiN, TaN, TaTi, TaSiN, Ta, W, Hf, HfN, Nb, Mo, $RuO_2$, RuO, MoN, WN, WSi, NiSi, $Ti_3Al$, $Ti_2AlN$, Pd, Ir, Pt, Co, Cr, CoSi, NiSi, and/or AlSi.

Figure 5:
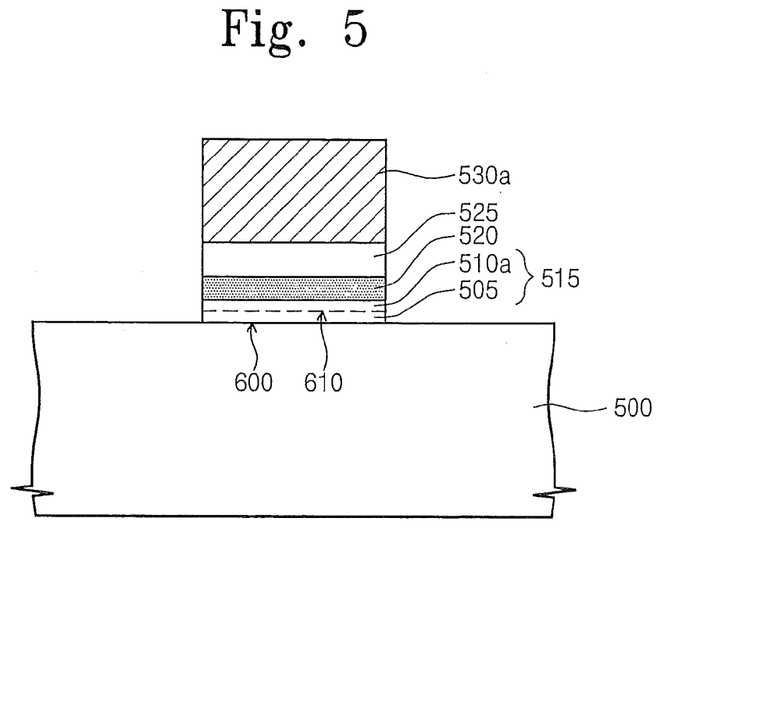

Referring to FIG. 5, the gate conductive layer 530 is patterned to form a gate electrode 530a. The gate electrode 530 crosses over the active region. When the charge storage layer 520 is formed of doped silicon or undoped silicon, the gate conductive layer 530, the blocking insulating layer 525, and the charge storage layer 520 may be successively etched. Thus, an electrically isolated charge storage layer 520 can be formed between the gate electrode 530a and the substrate 500.

Alternatively, when the charge storage layer 520 is formed of the above-mentioned insulating material, the gate conductive layer 530 may be etched using the blocking insulating layer 525 as an etch-stop layer to form the gate electrode 530a. Alternatively or additionally, the gate electrode 530a may be formed by successively etching the gate conductive layer 530, the blocking insulating layer 525, and the charge storage layer 520.

Figure 8:
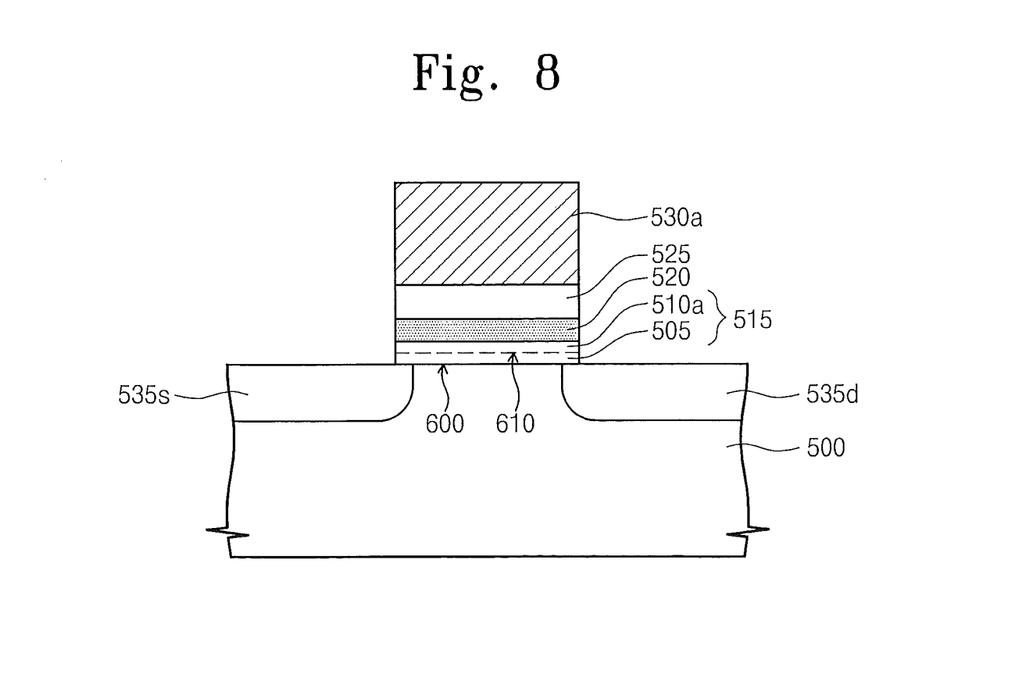
FIG. 8 is a cross-sectional view of a non-volatile memory device according to some embodiments of the present invention.

A source region 535s and a drain region 535d, shown in FIG. 8, are formed in the substrate 500 adjacent to opposite sides of the gate electrode 530a. The source and drain regions 535s and 535d can be formed by introducing dopant ions into the substrate 500. Alternatively, the source and drain regions 535s and 535d may be an inversion layer formed by inverting the surface of the substrate 500, such as by forming a material layer on the source and drain regions 535s and 535d to invert the surface of the substrate 500.

Thus, according to some exemplary methods of forming a non-volatile memory device, at least a portion of the nitride layer 510 is oxidized during the oxidation process to reduce free bonds in the nitride layer 510. Free bonds in the dielectric layer 515 or 515' between the charge storage layer 520 and the substrate 500 may thereby be reduced/minimized to enhance data retention properties and/or durability of the resulting non-volatile memory device.

If the free bonds in the dielectric layer 515 or 515' were not reduced as described herein, the charges stored in the charge storage layer 520 could more readily leak therefrom to the substrate 500 by tunneling using the free bonds, which would degrade the data retention properties of the non-volatile memory device. Moreover, if the free bonds in the dielectric layer 515 or 515' were not reduced as described herein, then during an erase operation and/or a program operation of the non-volatile memory device, tunneling charges may be trapped by the free bonds, which may change the program threshold voltage and erase threshold voltage over time with the repetition of the program and erase operations of the non-volatile memory device, and may therefore degrade the durability of the non-volatile memory device. However, as described above in accordance with various embodiments, the nitride layer 510 including a large amount of free bonds can be oxidized to reduce/minimize the free bonds in the dielectric layer 515. Thus, the data retention properties and/or the durability of the non-volatile memory device may be enhanced.

Following the formation of the oxide layer 505, a nitridation treatment can be performed to form a first nitrogen accumulation region at the first interface region 600. Nitrogen atoms of the first nitrogen accumulation region can bond to the free bonds of the first interface region 600 to suppress the leakage of charges stored in the charge storage layer 520 and prevent the charges from being trapped to such free bonds. Thus, the data retention properties and/or the durability of the non-volatile memory device may be enhanced.

Moreover, the nitrogen accumulation regions have a narrower energy band gap than portions formed of oxide in the dielectric layer 515 (e.g., the oxide layer 505 below the second nitrogen accumulation region and the oxidized nitride layer 510a on the second nitrogen accumulation region), which may enhance the efficiency of an erase operation in which the charges stored in the charge storage layer 520 are ejected to the substrate 500. Further, as illustrated in FIG. 7, when the dielectric layer 515' includes the residual nitride layer 510', an energy band gap of the residual nitride layer 510' is also narrower than that of portions formed of oxide in the dielectric layer 515', which may enhance the efficiency of an erase operation of the non-volatile memory device.

The blocking insulating layer 525 includes at least one insulating layer having a higher dielectric constant than a highest dielectric constant portion (e.g., a highest dielectric constant of a major portion) of the dielectric layer 515. Thus, a minimum field in the dielectric layer 515 is stronger than that in the blocking insulating layer 525 when a voltage is applied to the gate electrode 530a and to the substrate 500 to generate a potential difference therebetween. Therefore, the amount of charges migrating through the dielectric layer 515 increases while the amount of charges migrating through the blocking insulating layer 525 decreases. As a result, a difference between limit values of a program threshold voltage and an erase threshold voltage may increase and erase and program times may be reduced. Moreover, the data retention property of the non-volatile memory device may be enhanced. Due to the above effects, the non-volatile memory device according to various embodiments may operate as a multi-bit non-volatile memory device.

At least a portion of the gate conductive layer 530 contacting the blocking insulating layer 525 can have a work function that is equal to or higher than 4.0 eV. Accordingly, charge tunneling through the blocking insulating layer 525 may decrease, which can reduce program and/or erase times of a non-volatile memory device and increase a difference between limit values of a program threshold voltage and an erase threshold voltage.

A non-volatile memory device according to some embodiments of the present invention will now be further described below with reference to FIGS. 8 and 9.

Figure 9:
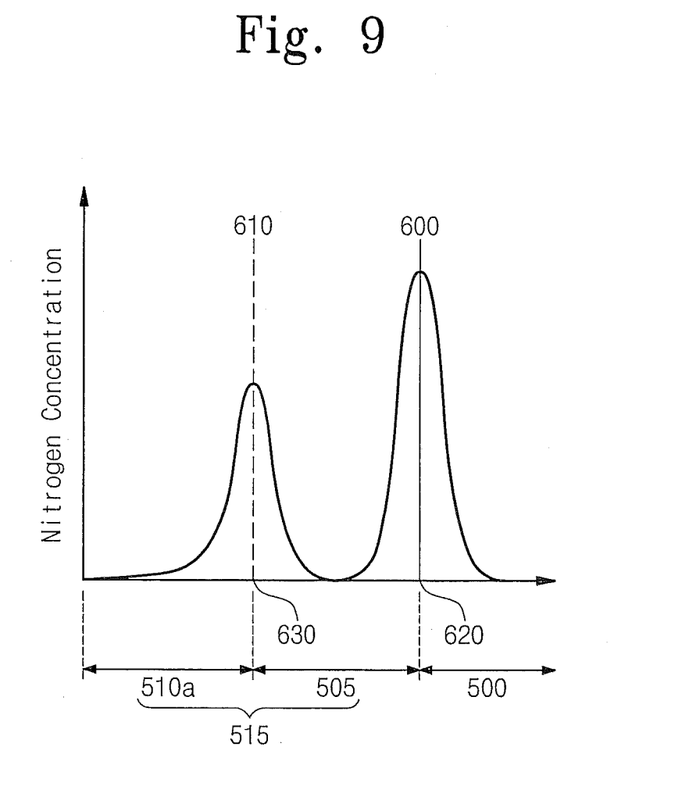
FIG. 9 is a graph illustrating concentrations of nitrogen in a dielectric layer of a non-volatile memory device according to exemplary embodiments of the present invention.

FIG. 8 is a cross-sectional view of a non-volatile memory device according to some embodiments of the present invention, and FIG. 9 is a graph illustrating a concentration of nitrogen in a dielectric layer of a non-volatile memory device according to an exemplary embodiment of the present invention. In FIG. 9, the x-axis represents positions and the y-axis represents a nitrogen concentration depending on the position.

Referring to FIGS. 8 and 9, a source region 535s and a drain region 535d are in a substrate 500 and are spaced apart from each other. A dielectric layer 515, a charge storage layer 520, a blocking insulating layer 525, and a gate electrode 530a are sequentially stacked on a channel region between the source region 535s and the drain region 535d.

The dielectric layer 515 includes an oxide layer. More specifically, the dielectric layer 515 includes an oxide layer 505 and an oxidized nitride layer 510a which are stacked in the order listed. The entirety of a deposited nitride layer may be fully oxidized to form the oxidized nitride layer 510a. Accordingly, the dielectric layer 515 may include a combined oxide layer that includes the oxide layer 505 and the oxidized nitride layer 510a. The dielectric layer 515 includes at least two regions having a substantially high nitrogen concentration, which is hereinafter referred to as nitrogen accumulation regions 620 and 630.

The first nitrogen accumulation region 620 is disposed at a first interface region 600 between the substrate 500 and the combined oxide layer included in the dielectric layer 515. The second nitrogen accumulation region 630 is disposed in the combined oxide layer included in the dielectric layer 515. The second nitrogen accumulation region 630 may be disposed at a second interface region 610 between the oxide layer 505 and the oxidized nitride layer 510a. A nitrogen concentration of the first nitrogen accumulation region 620 may be different from that of the second nitrogen accumulation region 630. In particular, the nitrogen concentration of the first nitrogen accumulation region 620 may be higher than that of the second nitrogen accumulation region 630. For example, the first nitrogen accumulation region 620 may have a nitrogen concentration in a range of 1 to 15 percent per volume, and the second nitrogen accumulation region 630 may have a nitrogen concentration in a range of 1 to 20 percent per volume. More generally, the first and second nitrogen accumulation regions 620 and 630 can have different nitrogen concentrations from each other.

As described above, the charge storage layer 520 includes a material to store charges. For example, the charge storage layer 520 may include at least one insulating layer having trap sites to store charges. In this case, the gate electrode 530a, the blocking insulating layer 525, and the charge storage layer 520 may have sidewalls that are aligned to each other. Alternatively, the blocking insulating layer 525 and the charge storage layer 520 may laterally extend so as to essentially cover the entirety of the substrate 500.

The charge storage layer 520 may be formed from doped silicon or undoped silicon. In this case, the charge storage layer 520 may have a patterned shape so as to be electrically isolated from other charge storage layers and/or features of the non-volatile memory device. For example, the gate electrode 530a, the blocking insulating layer 525, and the charge storage layer 520 can include sidewalls that are aligned to each other as illustrated in FIG. 8.

When a voltage is applied between the gate electrode 530a and the substrate 500 to generate a potential difference therebetween, a minimum field in the dielectric layer 515 is stronger than that in the blocking insulating layer 525. Since an electric field applied to an insulating layer is inversely proportion to its dielectric constant, the blocking insulating layer 525 includes at least one insulating layer having a higher dielectric constant than a highest dielectric constant portion (e.g., a highest dielectric constant of at least a major portion) of the dielectric layer 515. The blocking insulating layer 525 and the charge storage layer 520 can be formed from the same materials, such as described above with reference to FIG. 4 and, accordingly, further description thereof is omitted.

The gate electrode 530a is made of a conductive material. At least a portion of the gate electrode 530a contacting the blocking insulating layer 525 can be formed from a conductive material having a high work function of at least 4M eV. Therefore, it can be possible to decrease tunneling of charges migrating from the gate electrode 530a to the charge storage layer 520 through the blocking insulating layer 525. As a result, program operation efficiency and/or erase operation efficiency of a non-volatile memory device may be enhanced.

The gate electrode 530a can be made of the same material as described above with regard to FIG. 4, so further description thereof is omitted.

According to various embodiments of the foregoing non-volatile memory device, the dielectric layer 515 between the charge storage layer 520 and the substrate 500 can include the combined oxide layer in which free bonds are reduced/minimized and can have at least two nitrogen accumulation regions 620 and 630. Nitrogen atoms of the first nitrogen accumulation region 620 are bonded to the free bonds of the first interface region 600, thereby minimizing the free bonds of the first interface. The second nitrogen accumulation region 630 is disposed in the combined oxide layer, such as at the second interface region 610 between the oxidized nitride layer 510a and the oxide layer 505. The second interface region 610 is formed when a nitride layer is deposited on the oxide layer 505.

Accordingly, a number of free bonds may exist at the second interface region 610 when the nitride layer was formed on the oxide layer 505. In this case, nitrogen atoms of the second nitrogen accumulation region 630 may bond to the free bonds of the second interface region 610. At least some of the free bonds of the second interface region 610 may react with each other or react to oxygen so as to be eliminated through a process performed to fully oxidize the nitride layer. Because of the full oxidation of the nitride layer, the second interface region 610 in the dielectric layer 515 may exist with an undefined shape, unlike some interfaces between dissimilar materials. For example, the oxidized nitride layer 510a is essentially formed of oxide so that the second interface region 610 between the oxidized nitride layer 510a and the oxide layer 505 can appear to have a blended region therebetween, instead of a well defined interface therebetween.

The dielectric layer 515 can reduce/minimize free bonds between the gate electrode 530a and the substrate 500. Therefore, it may be possible to reduce/prevent charges stored in the charge storage layer 520 from leaking through the free bonds. Moreover, it may be possible to reduce/prevent charges from being trapped by the free bonds during read operations and/or program operations. As a result, data retention properties and/or durability of a non-volatile memory device may be enhanced.

A minimum field in the dielectric layer 515 can be stronger than that in the blocking insulating layer 525. Thus, program operation speed and/or erase operation speed of a non-volatile memory device may be increased while an operation voltage thereof may be decreased.

At least a portion of the gate electrode 530a contacting the blocking insulating layer 525 can have a high work function, which may decrease tunneling of charges migrating from the gate electrode 530a to the charge storage layer 520 through the blocking insulating layer 525. As a result, erasing efficiency and/or programming efficiency of a non-volatile memory device may be enhanced.

While the present invention has been particularly shown and described with respect to exemplary embodiments thereof, it will be understood by those skilled in the art that the foregoing and other changes in forms and details may be made without departing from the spirit and scope of the present invention. It is therefore intended that the present invention not be limited to the exact forms and details described and illustrated, but fall within the scope of the appended claims.

What is claimed is:

1. A method of forming a non-volatile memory device, the method comprising:
    forming a dielectric layer including an oxide layer and a nitride layer on a substrate;
    transforming at least a portion of the nitride layer extending across at least a major lateral extent of the dielectric layer to include added oxygen;
    forming a charge storage layer on the dielectric layer;
    forming a blocking insulating layer on the charge storage layer; and
    forming a gate electrode on the blocking insulating layer,
    wherein the transforming at least a portion of the nitride layer comprises oxidizing the nitride layer,
    wherein the nitride layer is fully oxidized,
    wherein an interface of the substrate and the oxide layer includes a first nitrogen accumulation region, and an interface of the oxide layer and the oxidized nitride layer includes a second nitrogen accumulation region having a lower nitrogen concentration than the first nitrogen accumulation region, and
    wherein the at least one insulating layer of the blocking insulating layer has a higher dielectric constant than a highest dielectric constant of at least a major portion of the dielectric layer.

2. The method of claim 1, further comprising:
    performing a nitridation treatment of the oxide layer to form the first nitrogen accumulation region at the interface of the substrate and the oxide layer before forming the nitride layer.

3. The method as recited in claim 1, wherein the nitride layer comprises silicon nitride or silicon oxynitride.

* * * * *